United States Patent
Blersch et al.

[11] Patent Number: 5,965,047
[45] Date of Patent: Oct. 12, 1999

[54] RAPID THERMAL PROCESSING (RTP) SYSTEM WITH ROTATING SUBSTRATE

[75] Inventors: Werner Blersch, Bussmannshausen; Peter Gruenwald, Schelklingen; Michael Maurer, Ulm; Helmut Merkle, Tomerdingen; Thomas Theiler, Ulm; Heinrich Walk, Allmendingen, all of Germany

[73] Assignee: Steag AST, Dornstadt, Germany

[21] Appl. No.: 08/960,150

[22] Filed: Oct. 24, 1997

[51] Int. Cl.⁶ .................................................. C23C 16/00
[52] U.S. Cl. ......................... 219/390; 118/730; 392/418
[58] Field of Search ................................. 219/390, 405, 219/411; 118/724, 725, 728, 730, 50.1; 392/416, 418

[56] References Cited

U.S. PATENT DOCUMENTS

| | | | |
|---|---|---|---|
| 5,108,792 | 4/1992 | Anderson et al. | 118/725 |
| 5,421,893 | 6/1995 | Perlov | 118/725 |
| 5,551,982 | 9/1996 | Anderson et al. | 118/725 |
| 5,551,985 | 9/1996 | Brors et al. | 118/725 |
| 5,584,936 | 12/1996 | Pickering et al. | 118/728 |
| 5,715,361 | 2/1998 | Moslehi | 392/416 |

*Primary Examiner*—Joseph Pelham
*Attorney, Agent, or Firm*—Rodney T Hodgson

[57] ABSTRACT

A rapid thermal processing (RTP) chamber, wherein one wall of the chamber supporting a substrate rotates with respect to the rest of the chamber so that the substrate being treated in the RTP chamber is relatively rotated with respect to the lamps heating the substrate.

22 Claims, 6 Drawing Sheets

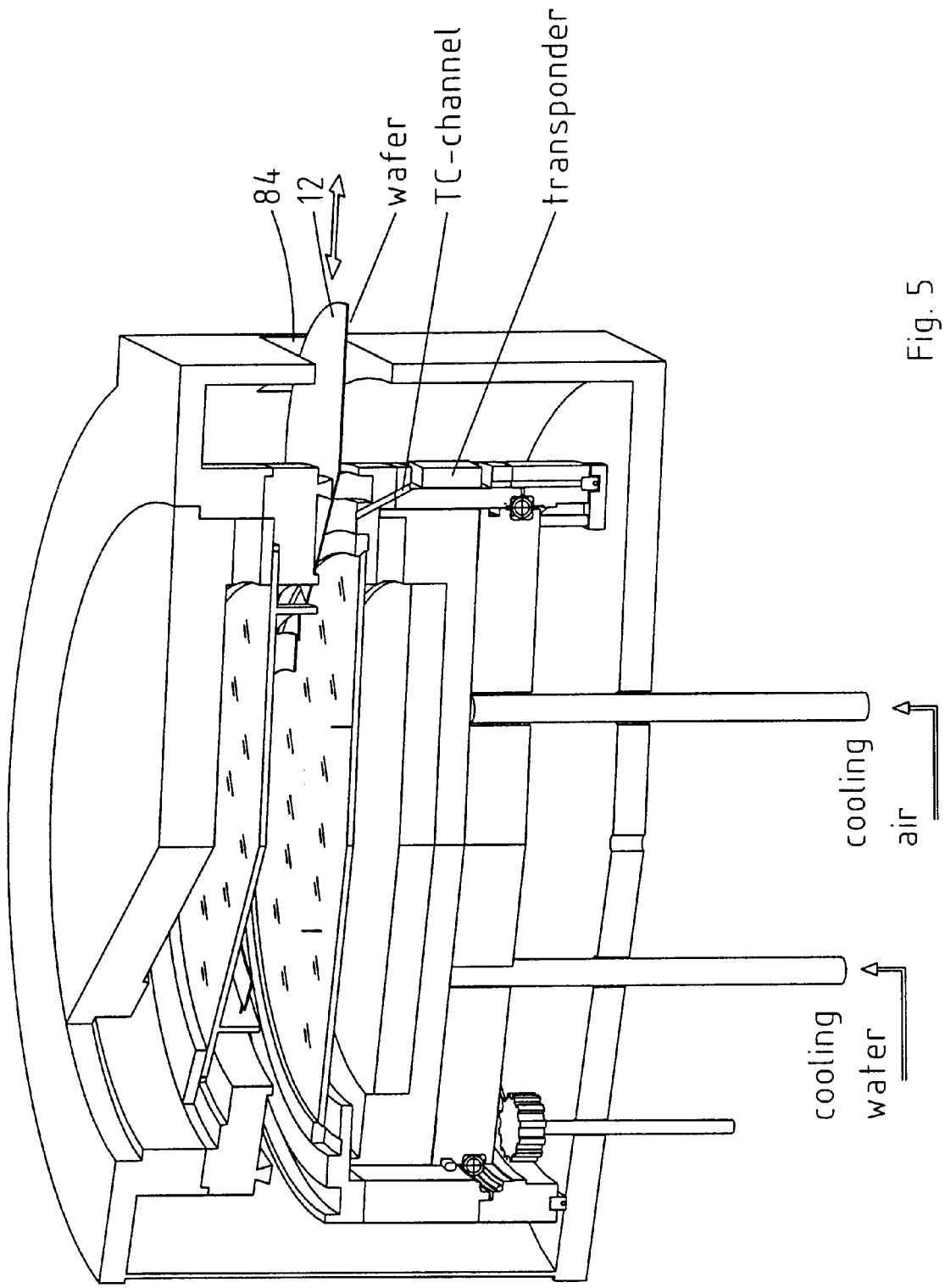

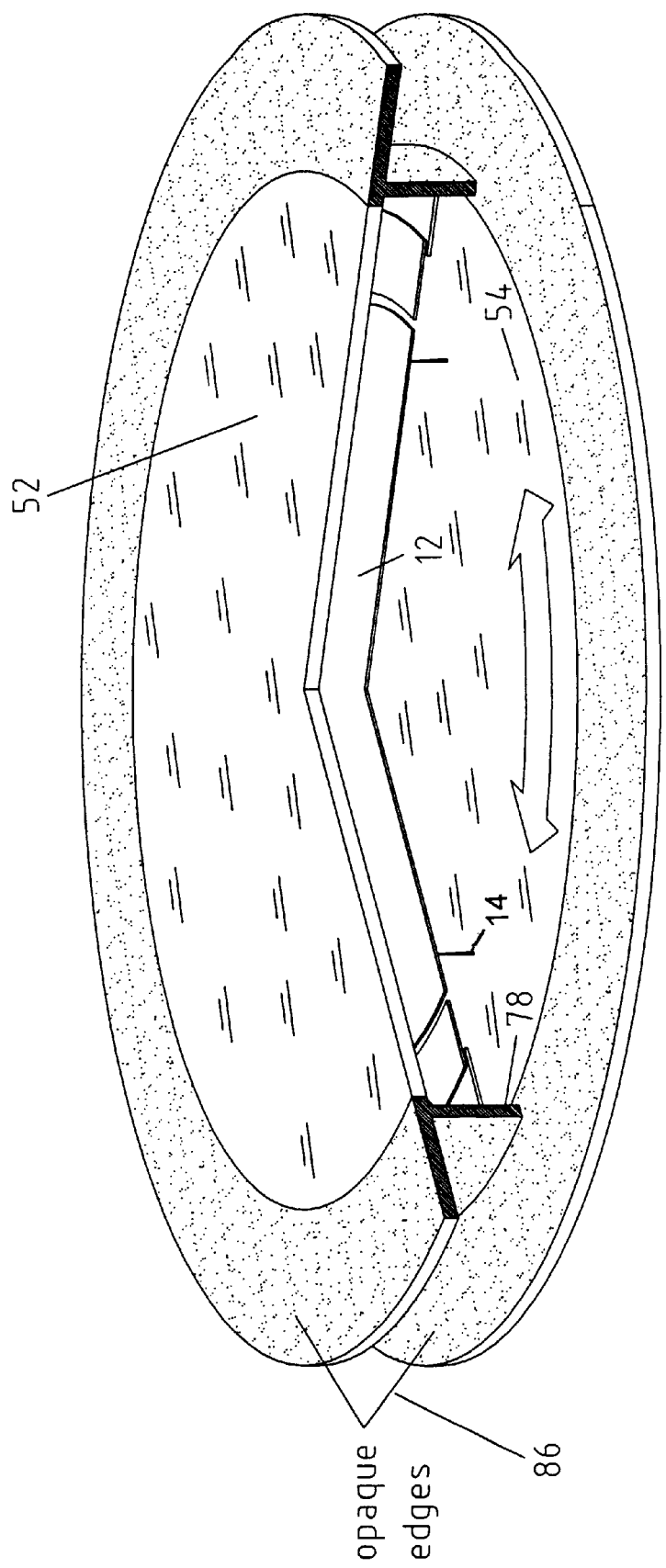

RAPID THERMAL PROCESSING (RTP) SYSTEM WITH ROTATING SUBSTRATE

FIELD OF THE INVENTION

The present invention relates to rapid thermal processing of delicate materials like semiconductor substrates. In particular, the present invention presents an apparatus and a method to irradiate a semiconductor wafer uniformly from both sides while the substrate is rotating.

BACKGROUND OF THE INVENTION

Rapid Thermal Processing (RTP) is a versatile optical heating method which can be used for semiconductor processing as well as a general, well controlled, method for heating objects or wafers which are in the form of thin sheets, slabs, or disks. The objects are generally inserted one at a time into a chamber which has at least some portions of the chamber walls transparent to transmit radiation from powerful heating lamps. The transparent portion of the walls is generally quartz, which will transmit radiation up to a wavelength of 3 to 4 microns. These lamps are generally tungsten-halogen lamps, but arc lamps or any other source of visible and/or near infrared radiation may be used. The radiation from the lamps is directed through the transparent portions of the walls on to the surface of the object to be heated. As long as the objects absorb light in the near infrared or visible spectral region transmitted by the transparent portion of the walls, RTP techniques allow fast changes in the temperature and process gas for the different material processes and conditions. RTP allows the "thermal budgets" of the various semiconductor processing to be reduced, as well as allows the production of various metastable states which can be "frozen in" when the material is cooled rapidly.

RTP systems are relatively new. In the last 10 or 15 years, such systems were used only in research and development. The thrust of the work was increasing the temperature uniformity, and developing heating cycles and processes which decreased the thermal budget. Prior art RTP machines can heat unstructured, homogeneous materials in the form of a flat plate or disk, and produce temperature uniformities across the plate adequate for semiconductor processing processes.

The temperature control in current RTP systems is mostly performed by monochromatic (or narrow wavelength band) pyrometry measuring temperature of the relatively unstructured and featureless backside of semiconductor wafers. The results of the temperature measurement are generally used in a feedback control to control the heating lamp power. Backside coated wafers with varying emissivity can not be used in this way, however, and the backside layers are normally etched away or the temperature is measured using contact thermocouples.

A newer method of temperature control is the power controlled open loop heating described in U.S. Pat. No. 5,359,693, which patent is hereby incorporated by reference.

German patent DE42 23 133 C2, hereby incorporated by reference, discloses a method of producing relatively defect free material in RTP machines. Apparatus induced thermal inhomogeneities have been reduced in the last few years because of the demand for more uniform processing. Among the techniques used have been control of the individual lamp power, use of circular lamps, and rotation of the semiconductor wafers with independent power control.

Most RTP machines have a thin rectangular quartz reaction chamber having one end open. Chambers meant for vacuum use often have a flattened oval cross section. Chambers could even be made in the form of a flat cylindrical pancake. In general, the chambers are used so that the thin objects to be heated are held horizontally, but they could also be held vertical or in any convenient orientation. The reactor chamber is usually thin to bring the lamps close to the object to be heated. The reactor chamber is opened and closed at one end with a pneumatically operated door when the wafer handling system is in operation. The door is usually made of stainless steel, and may have a quartz plate attached to the inside. The process gas is introduced into the chamber on the side opposite the door and exhausted on the door side. The process gas flow is controlled by computer controlled valves connected to various manifolds in a manner wet. known in the art.

RELATED APPLICATIONS

Reactors based on the RTP principle often have the entire cross section of one end of the reactor chamber open during the wafer handling process. This construction has been established because the various wafer holders, guard rings, and gas distribution plates, which have significantly greater dimensions and may be thicker than the wafers, must also be introduced into the chamber and must be easily and quickly changed when the process is changed or when different wafer sizes, for example, are used. The reaction chamber dimensions are designed with these ancillary pieces in mind. U.S. Pat. No. 5,580,830, assigned to the assignee of the present invention, hereby incorporated by reference, teaches the importance of the gas flow and the use of an aperture in the door to regulate gas flow and control impurities in the process chamber.

The wafer to be heated in a conventional RTP system typically rests on a plurality of quartz pins which hold the wafer accurately parallel to the reflector walls of the system. Prior art systems have rested the wafer on an instrumented susceptor, typically a uniform silicon wafer. Copending patent application Ser. No. 08/537,409, assigned to the assignee of the present invention, hereby incorporated by reference, teaches the importance susceptor plates separated from the wafer.

Rapid thermal processing of III–IV semiconductors has not been as successful as RTP of silicon. One reason for this is that the surface has a relatively high vapor pressure of, for example, arsenic (As) in the case of gallium arsenide (GaAs). The surface region becomes depleted of As, and the material quality suffers. Copending patent application Ser. No. 08/631,265, assigned to the assignee of the present invention, hereby incorporated by reference, supplies a method and apparatus for overcoming this problem.

OBJECTS OF THE INVENTION

It is an object of the invention to provide an apparatus and a method of uniformly heating a substrate in a rapid thermal processing system.

It is an object of the invention to uniformly irradiate a substrate from both sides while the substrate is rotating in a rapid thermal processing system.

SUMMARY OF THE INVENTION

In a rapid thermal processing system, the wafer is supported by one wall of the process chamber. At least a portion of the one wall rotates with respect to the rest of the process chamber, so that the substrate is rotated with respect to the process chamber and with respect to the radiation sources of the RTP system.

BRIEF DESCRIPTION OF THE DRAWINGS

FIG. 5 is a perspective cutaway view of the chamber of the invention.

FIG. 6 is a perspective cutaway view of the chamber of the invention.

DETAILED DESCRIPTION OF THE INVENTION

Figure 1:
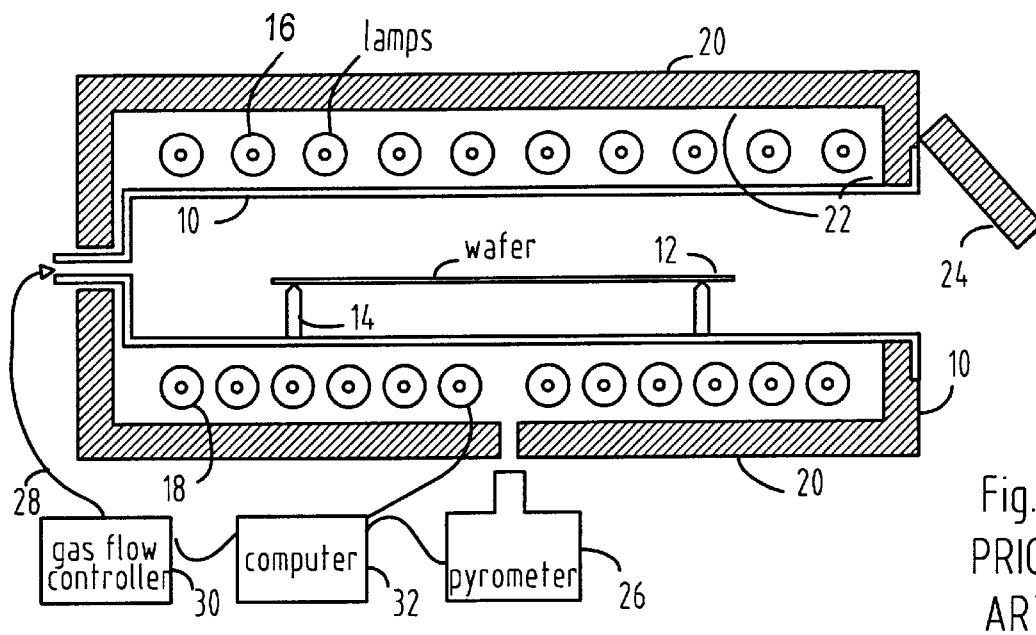
FIG. 1 is a sketch of a prior art open ended quartz reactor chamber RTP system with two banks of heating lamps.

FIG. 1 shows a cross sectional sketch of a prior art RTP chamber 10 with a wafer 12 supported by quartz pins 14 in position for heating by radiation from a set of lamps 16 and 18. The chamber 10 is supported by a housing 20 having highly polished interior walls 22. A door 24 is used to make a gas tight seal for the chamber 10. The temperature of the wafer 10 is measured by a pyrometer 26. A computer or other control means 32 receives the temperature reading from the pyrometer 26, and controls the lamps 16 and 18 to heat the wafer 12 according to a preprogrammed schedule. The computers 32 also serves to control a gas flow controller 30 which introduces process gas 28 into the chamber 10.

Rotation of susceptors bearing wafers is well known as a means of ensuring uniform heating and growth of films in semiconductor processes. However, prior art apparatus uses a rotating shaft penetrating the chamber to hold the susceptor and the wafer. Such a rotating shaft would disturb the heat flow from a lower set of lamps to a susceptor or a wafer.

Figure 2:
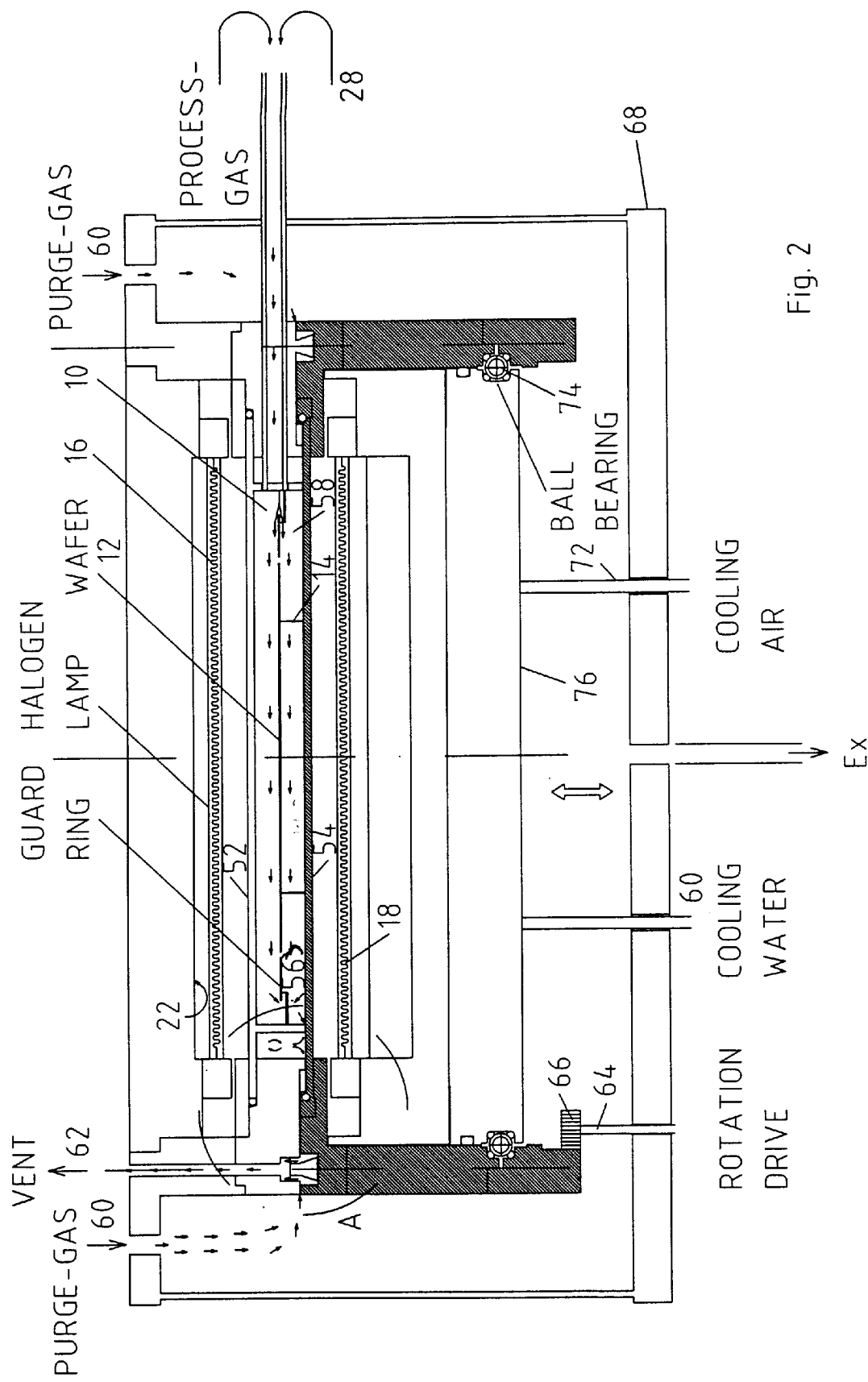
FIG. 2 is a sketch of the RTP chamber of the most preferred embodiment of the invention.

The most preferred apparatus of the invention is shown in cross section in FIG. 2. A semiconductor wafer 12 is supported by quartz pins 14 in position for RTP by lamps 16 and 18. The radiation from lamps 16 passes through the upper quartz wall 52 of the chamber 10, and the radiation from lamps 18 passes through the lower quartz wall 54. The lower quartz wall 54 rotates about its axis with respect to the upper quartz wall 52. The supporting members supporting the lower quartz wall 54 which rotate are hatched in FIG. 2. The upper quartz wall 52 and its supporting members are fixed, while the non rotating lower supporting members which support the rotating parts, the non rotating lamps 18, and the non rotating gas lines (identified later) may be lowered from the position shown in FIG. 2 to allow removal of wafer 12 and introduction of a new wafer. A guard ring 56 is supported by supports 58 which are affixed to the non rotating and non translating part of the chamber 10. When the wafer 12 is placed on pins 14 and the lower quartz plate 54 is raised into position, the wafer 12 is raised into position in the middle of the guard ring 56, and is substantial coplanar with the guard ring 56.

Process gas line 28, purge gas line 60, vent line 62, are shown fixed in position with respect to the upper part of chamber 10. A rotation drive shaft 64 and a gear drive 66 are sketched to show the means for rotation of the lower quartz window 54 with respect to the upper quartz window 52. The drive shaft 64 passes translatably through the fixed base 68 which supports the upper non rotating and non translating support members. A cooling water line 70 and a cooling air line 72 are also indicated schematically passing translatably through the base 68. The actual connections of lines 70 and 72 are not shown. The cooling water and cooling air lines for the upper non translatable members are not shown. A ball bearing race 74 is shown supporting the rotating members from the translatable base 76 supporting the lower movable members. The various gas flows are shown by arrows, and will be explained in more detail later.

Figure 3:
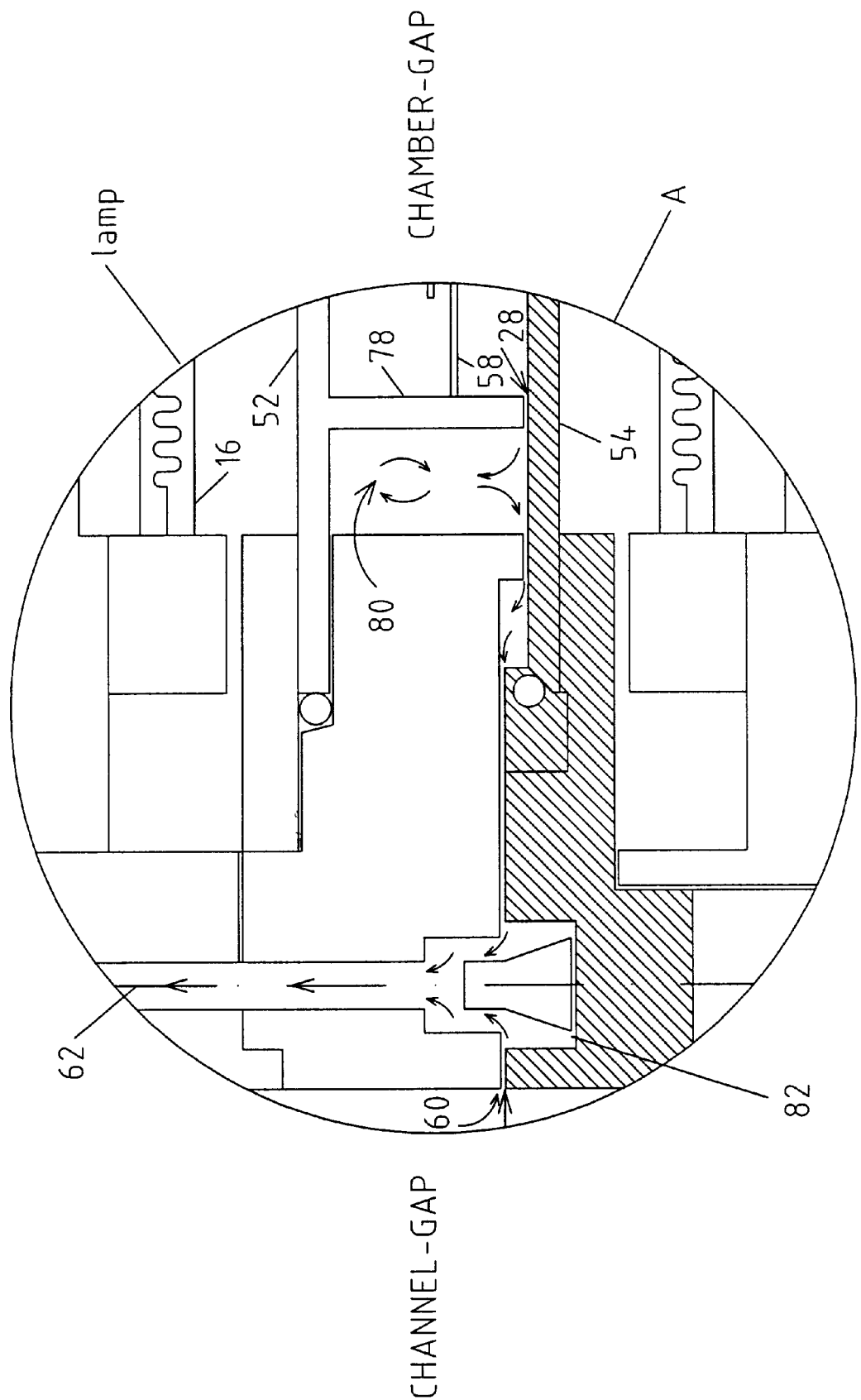
FIG. 3 is an expanded view of a part of the RTP chamber of the invention.

The sealing mechanism inside the circle denoted A in FIG. 2 is shown in m expanded view in FIG. 3 It is vital that the process chamber 10 be as clean as possible for semiconductor processing. In the present invention, there are no sliding seals to introduce particulate matter into the chamber 10. All seals are gas seals. The process gas 28 is introduced into the chamber 10 as shown in FIG. 3 and leaks out through a 100 micron gap between the rotatable quartz plate 54 and a quartz member 78 suspended from the fixed quartz plate 52. The process gas expands into an expansion space 80, then flows between the fixed and rotatable support members as shown and out vent 62. Purge gas 60 ensures that the process gas 28 does not enter the atmosphere surrounding the RTP chamber. An optional serpentine gas path 82 is shown to ensure that the purge gas does not enter the process chamber 10.

Figure 4:
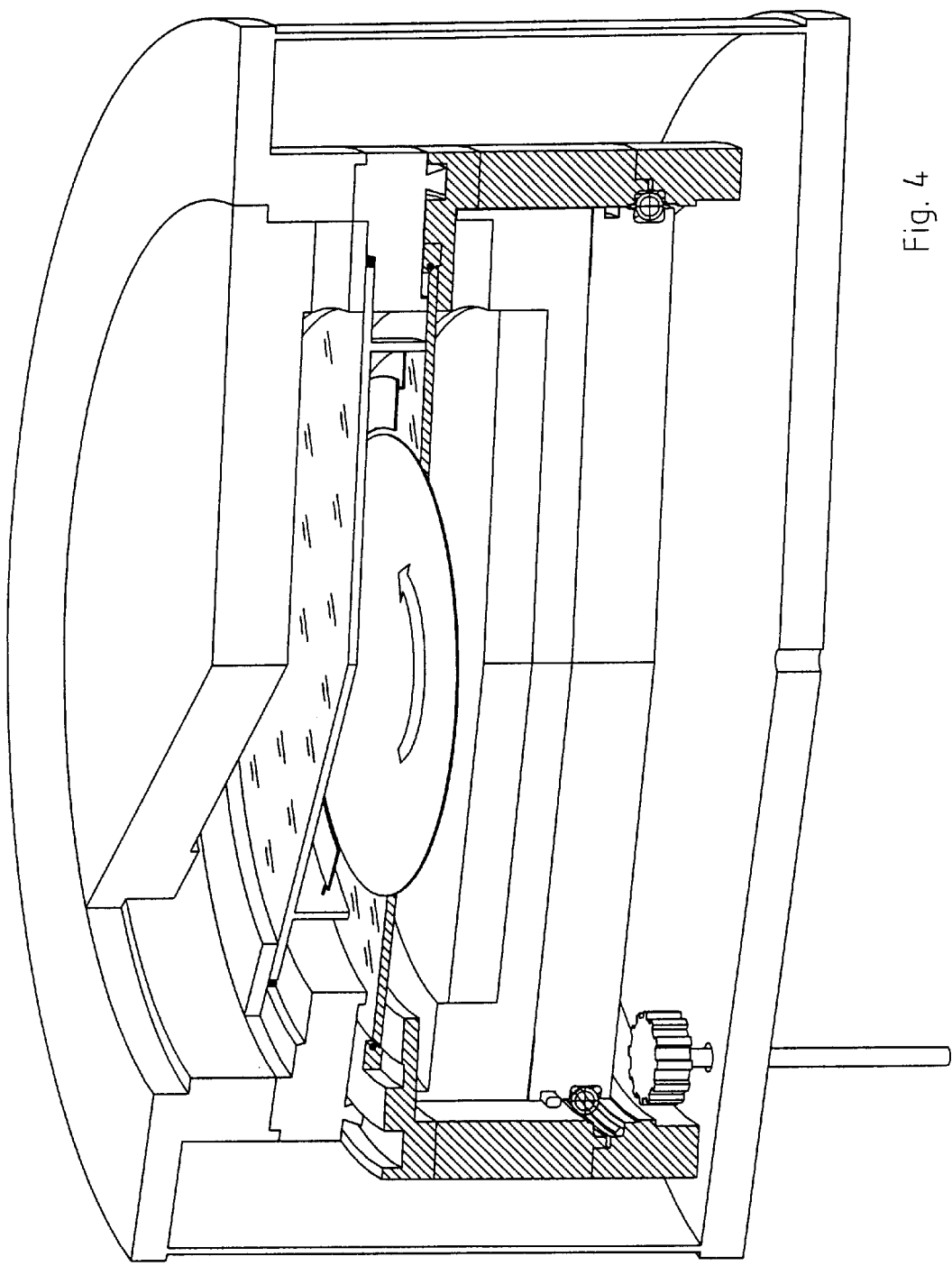
FIG. 4 is a perspective cutaway view of the chamber of the invention.

FIG. 4 shows a perspective cut away sketch of the apparatus with a wafer in position for RTP. (Lamps, cooling lines etc are not shown.) The rotating parts are shown hatched. FIG. 5 shows the lower part of the chamber lowered and the wafer 12 being inserted or withdrawn from the chamber 12 through a door 84 in the apparatus.

FIG. 6 shows a cutaway perspective view of the quartz upper plate 52 and the lower plate 54 which supports the wafer 12 on pins 14. A quartz base holding pins 14 is not shown. The edges of the quartz plates 52 and 54, and the member 78, are shown as being opaque quartz 86. This opaque quartz material is quartz full microscopic voids which makes the thermal resistivity of the quartz much higher and cuts down the conduction of heat from the center of the quartz plates 52 and 54 to the surrounding metal supports. The "opaque" quartz also scatters the light which is trapped in the quartz (like a light pipe) and allows the light energy to exit the quartz before it reaches the metal walls and support members.

Figure 7:
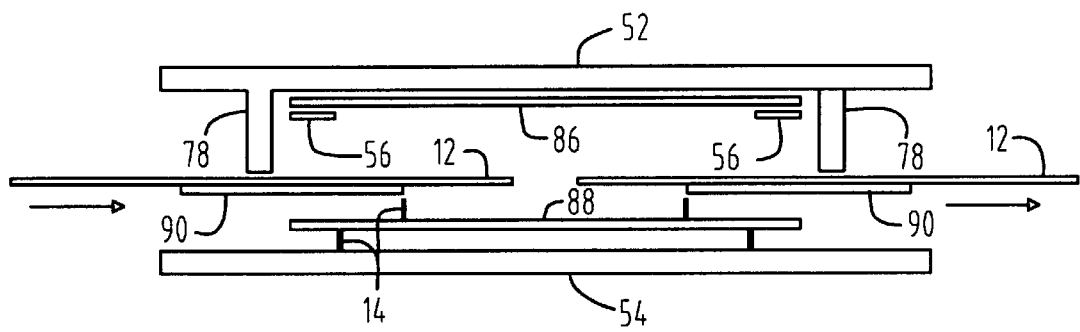
FIG. 7 shows the chamber in its open position.

FIG. 7 shows an elevation view of the upper quartz plate 52 and the lower quartz plate 54 lowered to allow introduction of a product wafer 12. The invention allows the innovative simultaneous introduction of one wafer from one side of the chamber while the previously treated wafer is withdrawn from another side. The entire process is speeded up by the time normally taken for a robot arm (not shown) to withdraw a vacuum pan 90 carrying the wafer 12 to insert the withdrawn wafer into a receiving cassette and to pick up an untreated wafer for introduction into the chamber. FIG. 7 also shows the placement of ancillary heating plates 86 and 88 above and below the wafer.

We claim:

1. A rapid thermal processing (RTP) chamber for processing a semiconductor wafer, comprising;

a first wall, the first wall for supporting the semiconductor wafer in close proximity to the first wall, the first wall having a portion of the first wall transparent to radiation from radiation sources of an RTP system, the portion of the first wall transparent over at least an area of the first wall corresponding to the area of the sermiconductor wafer; and a second wall substantially parallel to the first wall, wherein the second wall is fixed with respect to the radiation sources and wherein the first wall is rotatable by rotation means with respect to the second wall about an axis perpendicular to the first wall, and wherein the rotation means allows uniform illumination of the water by radiation passing directly from the radiation sources through the transparent portion of the rotating wall.

2. The apparatus of claim 1, wherein the first wall and the second wall may be relatively translated in a direction substantially perpendicular to the first and the second walls to open and close the chamber.

3. The apparatus of claim 2, where a guard ring is supported fixedly with respect to the second wall, and a semiconductor wafer may be supported by the rotatable portion of the first wall, whereby the guard ring and the semiconductor wafer may be relatively translated so that the wafer is substantially coplanar with and may rotate inside the guard ring when the chamber is closed.

4. The apparatus of claim 1, wherein both the first and the second walls have substantial portions transparent to radiation from the radiation sources of the RTP system.

5. The apparatus of claim 4, wherein the first wall and the second wall may be relatively translated in a direction substantially perpendicular to the first and the second walls to open and close the chamber.

6. The apparatus of claim 5, where a guard ring is supported fixedly with respect to the second wall, and a semiconductor wafer may be supported by the rotatable portion of the first wall, whereby the guard ring and the semiconductor wafer may be relatively translated so that the wafer is substantially coplanar with and inside the guard ring when the chamber is closed.

7. The apparatus of claim 1, further comprising;
a serpentine gas seal to seal the relatively rotating portion of the first wall and second wall against entry of gases into the chamber.

8. A rapid thermal processing (RTP) system for processing a semiconductor wafer, comprising;
a radiation source;
a chamber, the chamber comprising a first wall; and a second wall substantially parallel to the first wall, the first wall for supporting the semiconductor wafer in close proximity to the first wall, the first wall having a portion of the first wall transparent to radiation from the radiation source, the portion of the first wall transparent over at least an area of the first wall corresponding to the area of the semiconductor wafer, and wherein the second wall is fixed with respect to the radiation sources, and wherein the first wall is rotatable by rotation means with respect to the second wall about an axis perpendicular to the first wall, and wherein the rotation means allows uniform illumination of the wafer by radiation passing directly from the radiation source through the transparent portion of the rotating first wall;
means for introducing a gas into the chamber; and
a means for controlling the radiation source and the means for introducing gas into the chamber.

9. The system of claim 8, where a guard ring is supported fixedly with respect to the second wall, and a semiconductor wafer may be supported by the rotatable portion of the first wall, whereby the guard ring and the semiconductor wafer may be relatively translated so that the wafer is substantially coplanar with and may rotate inside the guard ring when the chamber is closed.

10. A rapid thermal processing (RTP) chamber for processing a semiconductor wafer, comprising;
a plurality of enclosing walls for enclosing an object, a portion of at least one enclosing wall transparent to radiation from a radiation source of an RTF system, at least a portion of at least a first enclosing wall rotatable with respect to the chamber when the chamber is closed, the first wall for supporting the semiconductor wafer in close proximity to the first wall, the first wall having a portion of the first wall transparent to radiation from the radiation source, the portion of first wall transparent over at least an area of the first wall corresponding to the area of the semiconductor wafer, and wherein the first wall is rotatable by rotation means with respect to the radiation source about an axis perpendicular to the first wall, and wherein the rotation means allows uniform illumination of the wafer radiation passing directly from the radiation source through the transparent portion of the rotating first wall.

11. The apparatus of claim 10, wherein the rotatable portion is substantially transparent to radiation from a radiation source of the RTP system.

12. The apparatus of claim 10, wherein the rotatable portion may be relatively translated with respect to the chamber to open and close the chamber.

13. The apparatus of claim 12, where a guard ring is supported fixedly with respect to the non rotating part of the chamber, and a semiconductor wafer may be supported by the rotatable portion, whereby the guard ring and the semiconductor wafer may be relatively translated so that the wafer is substantially coplanar with and inside the guard ring when the enclosure is closed.

14. The apparatus of claim 13, wherein the rotatable portion is substantially transparent to radiation from a radiation source of the RTP system.

15. The apparatus of claim 12, wherein the rotatable portion is substantially transparent to radiation from a radiation source of the RTP system.

16. The apparatus of claim 10, further comprising;
a serpentine gas seal to seal the rotatable portion against entry of gases into the chamber.

17. A rapid thermal processing (RTP) chamber (10) for processing a semiconductor wafer (12) in an RTP-system, comprising;
a first wall (54);
a second wall (52) substantially parallel to the first wall (54); and
a member (78) depending from the second wall (52), keeping a gap between the member (78) and the first wall (54),
wherein the first wall (54) and the second wall (52) have at least one portion transparent to radiation from the radiation sources of the RTP-system, and
the wherein first wall (54) is rotatable with respect to the second wall (52) and the member (78) about an axis perpendicular to the first wall (54).

18. A RTP chamber according to claim 17, wherein the member (78) and the edges of the first and second walls (54, 52) are made of opaque quartz material.

19. A RTP chamber according to claim 17, additionally comprising ancillary heating plates (86, 88) above and below the wafer (12).

20. A RTP chamber according to claim 17, wherein the first wall (54) and the second wall (52) may be relatively translated in a direction substantially perpendicular to the first and second walls (54, 52) to open and close the chamber (10).

21. A RTP chamber according to claim 17, wherein a guard ring (56) is supported fixedly with respect to the second wall (52), and a semiconductor wafer (12) may be supported by the rotatable portion of the first wall (54), whereby the guard ring (56) and the semiconductor wafer (12) may be relatively translated so that the wafer (12) is substantially coplanar with and may rotate inside the guard ring (56) when the chamber (10) is closed.

22. A RTP chamber according to claim 17, comprising a serpentine gas seal (82) to seal the relatively rotating portion of the first wall (54) and the second wall (52) against entry of gases into the chamber (10).

* * * * *